United States Patent
Zhang et al.

(10) Patent No.: US 10,916,265 B2
(45) Date of Patent: Feb. 9, 2021

(54) MULTI-LAYER ACTUATOR ELECTRODE CONFIGURATION FOR RESONANCE IMPROVEMENT

(71) Applicant: Magnecomp Corporation, Murrieta, CA (US)

(72) Inventors: Long Zhang, Murrieta, CA (US); Kuen Chee Ee, Chino, CA (US); David Glaess, Bangkok (TH); Preecha Sudachun, Wangnoi (TH); Ekaratch Pankaew, Wangnoi (TH)

(73) Assignee: Magnecomp Corporation, Murrieta, CA (US)

( * ) Notice: Subject to any disclaimer, the term of this patent is extended or adjusted under 35 U.S.C. 154(b) by 0 days.

(21) Appl. No.: 16/911,249

(22) Filed: Jun. 24, 2020

(65) Prior Publication Data

US 2021/0012795 A1    Jan. 14, 2021

Related U.S. Application Data

(60) Provisional application No. 62/871,505, filed on Jul. 8, 2019.

(51) Int. Cl.
| | |
|---|---|
| *G11B 5/48* | (2006.01) |
| *H01L 41/047* | (2006.01) |
| *H01L 41/09* | (2006.01) |
| *H01L 41/083* | (2006.01) |

(52) U.S. Cl.
CPC ............ *G11B 5/483* (2015.09); *G11B 5/4873* (2013.01); *H01L 41/0471* (2013.01); *H01L 41/083* (2013.01); *H01L 41/094* (2013.01)

(58) Field of Classification Search
CPC .............................. G11B 5/483; G11B 5/4873
USPC ................................................ 360/294–294.6
See application file for complete search history.

(56) References Cited

U.S. PATENT DOCUMENTS

| | | | | |
|---|---|---|---|---|
| 8,680,749 | B2 * | 3/2014 | Xu ........................ | H01L 41/083 310/339 |
| 2009/0244205 | A1 * | 10/2009 | Kura ..................... | B41J 2/14233 347/68 |
| 2010/0110120 | A1 * | 5/2010 | Hattori ................... | B41J 19/202 347/9 |
| 2015/0035906 | A1 * | 2/2015 | Mizuno ................. | B41J 2/14209 347/50 |

* cited by examiner

*Primary Examiner* — Allen T Cao
(74) *Attorney, Agent, or Firm* — DLA Piper LLP (US)

(57) ABSTRACT

A piezoelectric actuator assembly is described. The piezoelectric actuator assembly includes a first, second and third active piezoelectric layers. The first layer includes a top surface and a bottom surface. The second layer includes a top surface and a bottom surface over the top surface of the first layer. The third layer includes a top surface and a bottom surface over the top surface of the second layer. The first and second layers can define a first effective electrode length. Similarly, the second and third layers can define a second effective electrode length configured to be longer than the first effective electrode length.

12 Claims, 7 Drawing Sheets

MULTI-LAYER ACTUATOR ELECTRODE CONFIGURATION FOR RESONANCE IMPROVEMENT

RELATED APPLICATIONS

This application claims the benefit of, and priority to, U.S. Provisional Patent Application Ser. No. 62/871,505, filed Jul. 8, 2019, titled Multi-Layer Actuator Electrode Configuration for Resonance Improvement, the entire disclose of which is hereby incorporated by reference.

FIELD

Embodiments of the disclosure relate to the field of suspension devices for disk drives. More particularly, this disclosure relates to the field of multi-layer actuator construction for a suspension device.

BACKGROUND

A typical disk drive unit includes a spinning magnetic disk containing a pattern of magnetic storage medium ones and zeroes. The pattern of magnetic storage medium ones and zeroes constitutes the data stored on the disk drive. The magnetic disk is driven by a drive motor. The disk drive unit also includes a disk drive suspension to which a magnetic read/write head is mounted proximate a distal end of load beam. The "proximal" end of a suspension or load beam is the end that is supported, i.e., the end nearest to the base plate which is swaged or otherwise mounted to an actuator arm. The "distal" end of a suspension or load beam is the end that is opposite the proximal end, i.e., the "distal" end is the cantilevered end.

The suspension is coupled to an actuator arm, which in turn is coupled to a voice coil motor that moves the suspension arcuately in order to position the head slider over the correct data track on the data disk. The head slider is carried on a gimbal which allows the slider to pitch and roll so that it follows the proper data track on the disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only the voice coil motor moves the suspension.

In a DSA suspension a small actuator located on the suspension moves the head slider in order to position the head slider over the correct data track. The actuator provides both finer positioning of the head slider than does the voice coil motor, and provides higher servo bandwidth than does the voice coil motor. The actuator may be located in various places on the suspension depending on the particular DSA suspension design. Typically, left- and right-side actuators act in push-pull fashion to rotate the load beam or the distal end of the load beam.

SUMMARY

A piezoelectric actuator assembly is described. The piezoelectric actuator assembly includes a first, second and third active piezoelectric layers. The first layer includes a top surface and a bottom surface. The second layer includes a top surface and a bottom surface over the top surface of the first layer. The third layer includes a top surface and a bottom surface over the top surface of the second layer. The first and second layers can define a first effective electrode length. Similarly, the second and third layers can define a second effective electrode length is configured to be longer than the first effective electrode length.

In some embodiments, a first electrode is disposed on at least a portion of the bottom surface of the first single active piezoelectric layer. A second electrode is disposed between at least a portion of the first single active piezoelectric layer and the second single active piezoelectric layer. A shared length of the first electrode and the second electrode defines the first effective electrode length.

In some embodiments, a third electrode is disposed between at least a portion of the second layer and the third layer. A fourth electrode is disposed on at least a portion of top surface of the third layer. A shared length of the third electrode and the fourth electrode defines the second effective electrode length.

In some embodiments, the second effective electrode length is 0.02 mm longer than the first effective electrode length. In some embodiments, the first effective electrode length is 0.59 mm. In some embodiments, the second effective electrode length is 0.61 mm.

A suspension is described. The suspension includes a flexure mounted to a load beam, an electrical circuit mounted to the flexure, and a multi-layer piezoelectric microactuator PZT connected to the electrical circuit. The multi-layer piezoelectric microactuator PZT includes a first, second and third active piezoelectric layers. The first layer includes a top surface and a bottom surface. The second layer includes a top surface and a bottom surface over the top surface of the first layer. The third layer includes a top surface and a bottom surface over the top surface of the second layer. The first and second layers can define a first effective electrode length. Similarly, the second and third layers can define a second effective electrode length configured to be longer, for example between 0.01 and 0.05 mm longer, than the first effective electrode length.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

In order to describe the manner in which the advantages and features of the disclosure can be obtained, embodiments of the present disclosure are described with reference to specific examples illustrated in the appended drawings. These drawings depict only example aspects of embodiments of the present disclosure, and are therefore not to be considered as limiting of its scope. The principles are described and explained with additional specificity and detail through the use of the following drawings.

DETAILED DESCRIPTION

Figure 1:
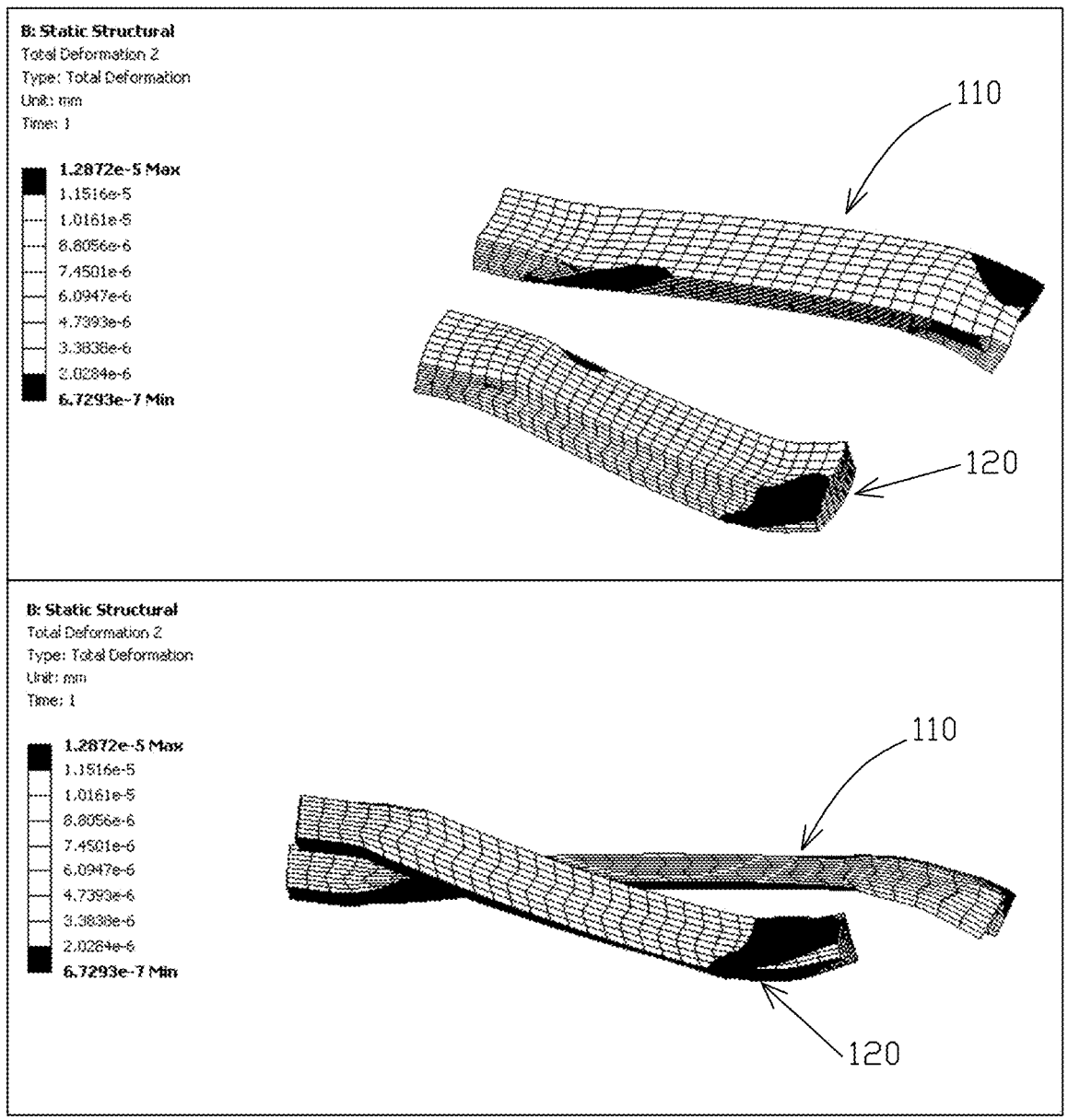
FIG. 1 illustrates microactuators undergoing deformation.

The embodiments of the present disclosure are described with reference to the attached figures, wherein like reference numerals are used throughout the figures to designate similar or equivalent elements. The figures are not drawn to scale, and they are provided as exemplary illustrations. Several aspects of the embodiments are described below with reference to example applications, which are not intended to limit the scope of this disclosure. It should be understood that numerous specific details, relationships, and methods are set forth to provide a full understanding of the embodiments.

Embodiments described herein are directed to multi-layer microactuators that overcome problems with in the current state of microactuators. For example, as the left- and right-side microactuators act in push-pull fashion to rotate the load beam or the distal end of the load beam, both microactuators bend in the vertical direction.

FIG. 1 illustrates deformation of the microactuators 110 and 120. The microactuator 110 pushes out and bends in convex, while the microactuator 120 pulls back and bends in concave. Such a paddling out-of-plane motion can easily excite the torsion related modes of the whole suspension, such as load beam torsion mode and gimbal flexure torsion mode.

Figure 2A:
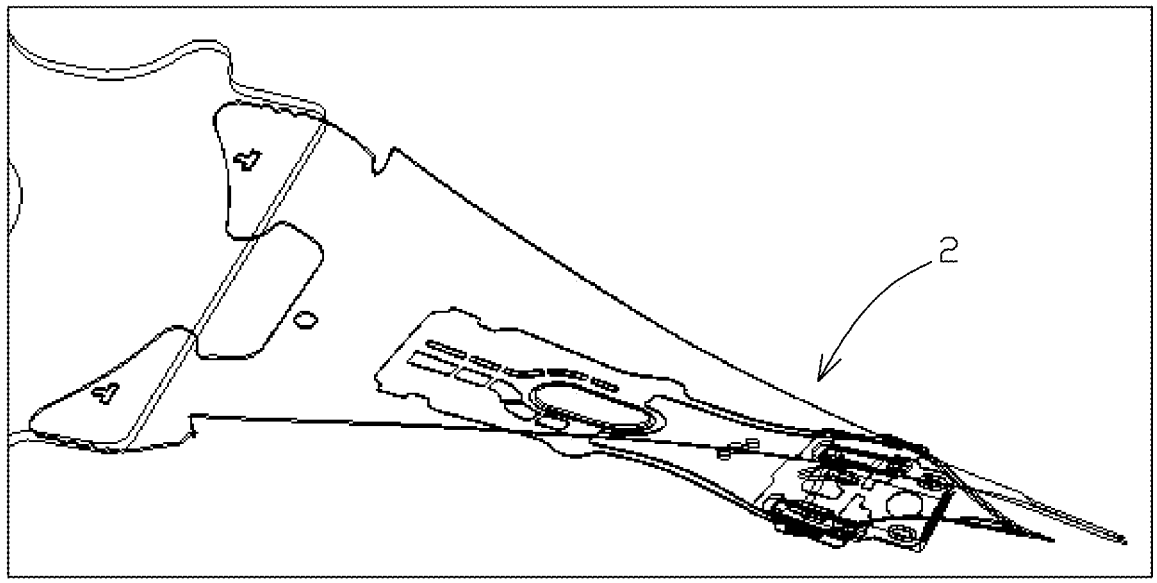
FIG. 2A illustrates torsion related modes of a suspension with the microactuators of FIG. 1.
Figure 2B:
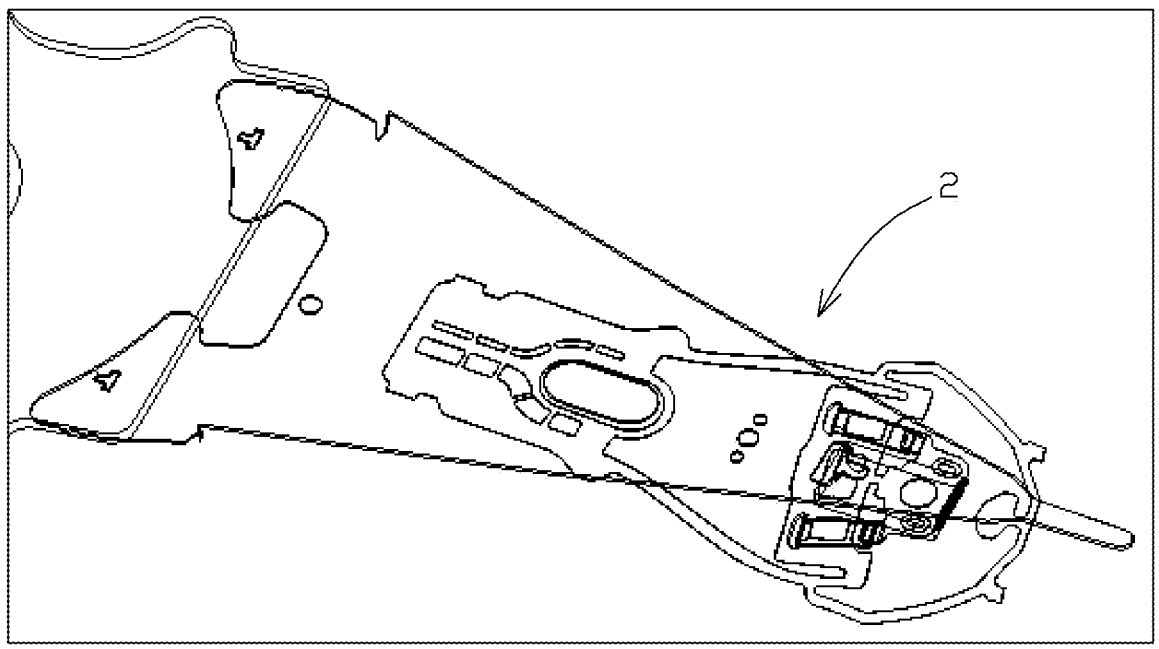
FIG. 2B illustrates load beam torsion mode and gimbal flexure torsion mode of the suspension with the microactuators of FIG. 1.
Figure 7:
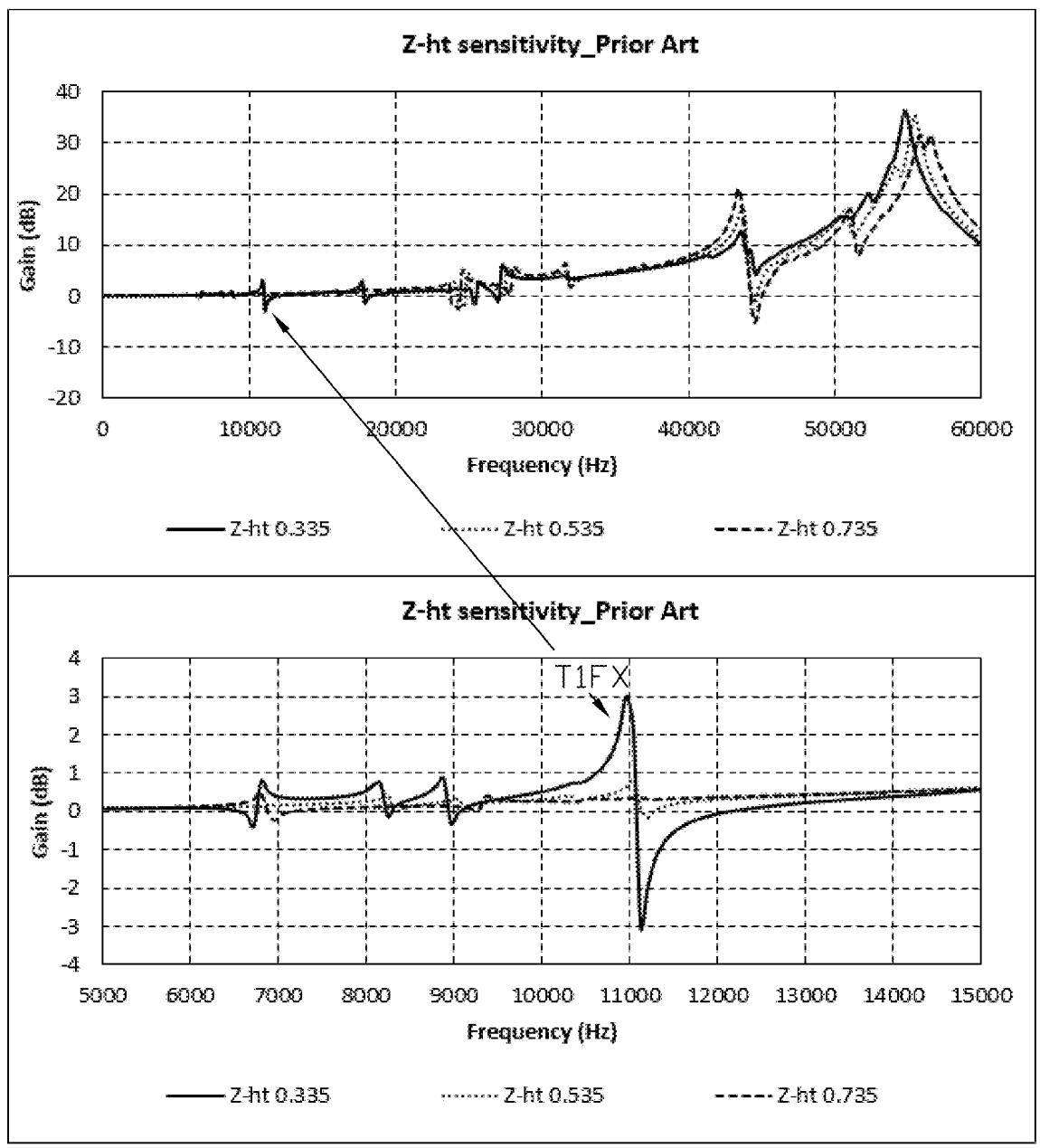
FIG. 7 is a graphical representation of a resonant frequency (FRF) of a multi-layer PZT, as known, under a one (1) volt actuation.

FIG. 2A illustrates torsion related modes of the whole suspension 2. FIG. 2B illustrates load beam torsion mode and gimbal flexure torsion mode of the whole suspension 2. The excitation of these torsion modes can cause the head slider to undergo lateral motion and result in an off-track problem to the read/write operation. For example, a resonant frequency (FRF) of the conventional multi-layer PZT has a high T1FX mode (gimbal flexure torsion mode) peak of −3 dB at 11 kHz under a z-ht variation of +/−0.2 mm, as is shown in FIG. 7. Such a low frequency peak requires the drive servo design to place a notch filter at T1FX mode frequency, which then impacts on drive servo bandwidth. The present disclosure provides a configuration of the multi-layer actuator to reduce this out-of-plane motion to enable better performance characteristics over the current state of multi-layer actuators.

One having ordinary skill in the relevant art, however, will readily recognize that the invention can be practiced without one or more of the specific details, or with other methods. In other instances, well-known structures or operations are not shown in detail to avoid obscuring the embodiments. Embodiments of the present disclosure are not limited by the illustrated ordering of acts or events, as some acts may occur in different orders and/or concurrently with other acts or events. Furthermore, not all illustrated acts or events are required to implement a methodology in accordance with the present invention.

Figure 3:
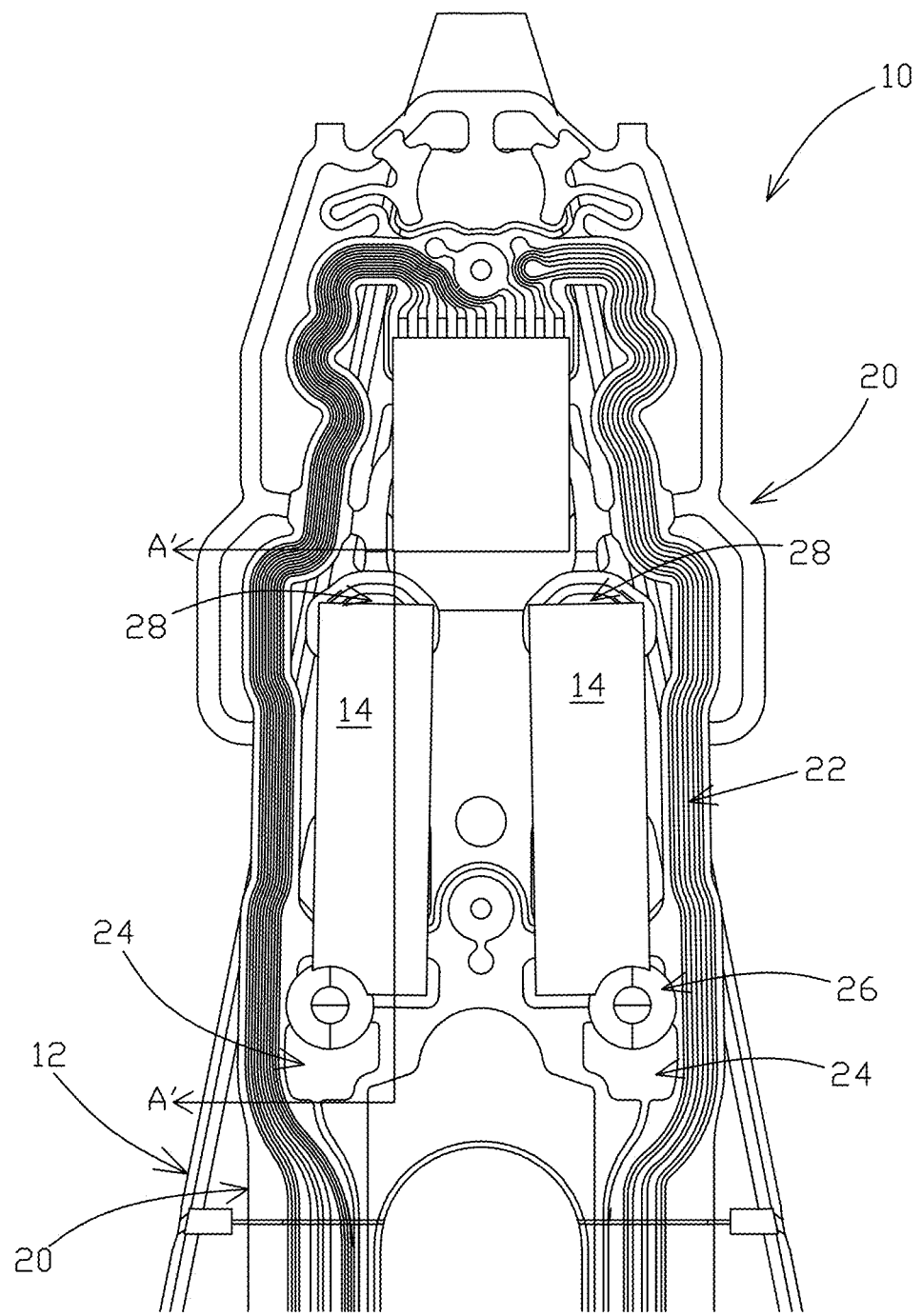
FIG. 3 illustrates a suspension including actuators in accordance with an embodiment of the disclosure.

FIG. 3 illustrates a suspension 10 including actuators in accordance with an embodiment of the disclosure. Embodiments of a suspension include, but are not limited to, dual stage actuated (DSA) suspensions, tri-stage actuated suspensions, and other configurations of actuators on a suspension. The suspension 10 includes a flexure 20, which is mounted to a load beam 12. The flexure 20 also includes an electrical circuit 22, which includes copper contact pads 24. The DSA suspension 10 also includes two multi-layer piezoelectric microactuators (PZTs) 14 mounted near a gimbal. The copper contact pads 24 are configured to carry the driving voltage to the multi-layer PZT 14. The suspension 10 also includes grounded copper contact pads 28 for each multi-layer PZT 14.

The gimbal allows the slider to pitch and roll so that it follows the proper data track on the disk, allowing for such variations as vibrations of the disk, inertial events such as bumping, and irregularities in the disk's surface. The multi-layer PZTs 14 act directly on the gimbal through flexible connectors. Such suspensions are sometimes called gimbal DSA suspensions, or simply GSA suspensions. A GSA suspension is one type of DSA suspension. Other arrangements of the multi-layer PZTs 14 can be used to actuate suspensions, including, but not limited to, tri-stage actuated suspensions. Under a driving voltage, one multi-layer PZT 14 is set to expand, while the other is set to contract so that the gimbal is rotated about a loadbeam dimple to position the head slider read/writer heads on the spinning disk. The multi-layer PZT 14 in FIG. 3 is annotated with cross-section A-A,' discussed in more detail below with respect to FIG. 4.

Figure 4:
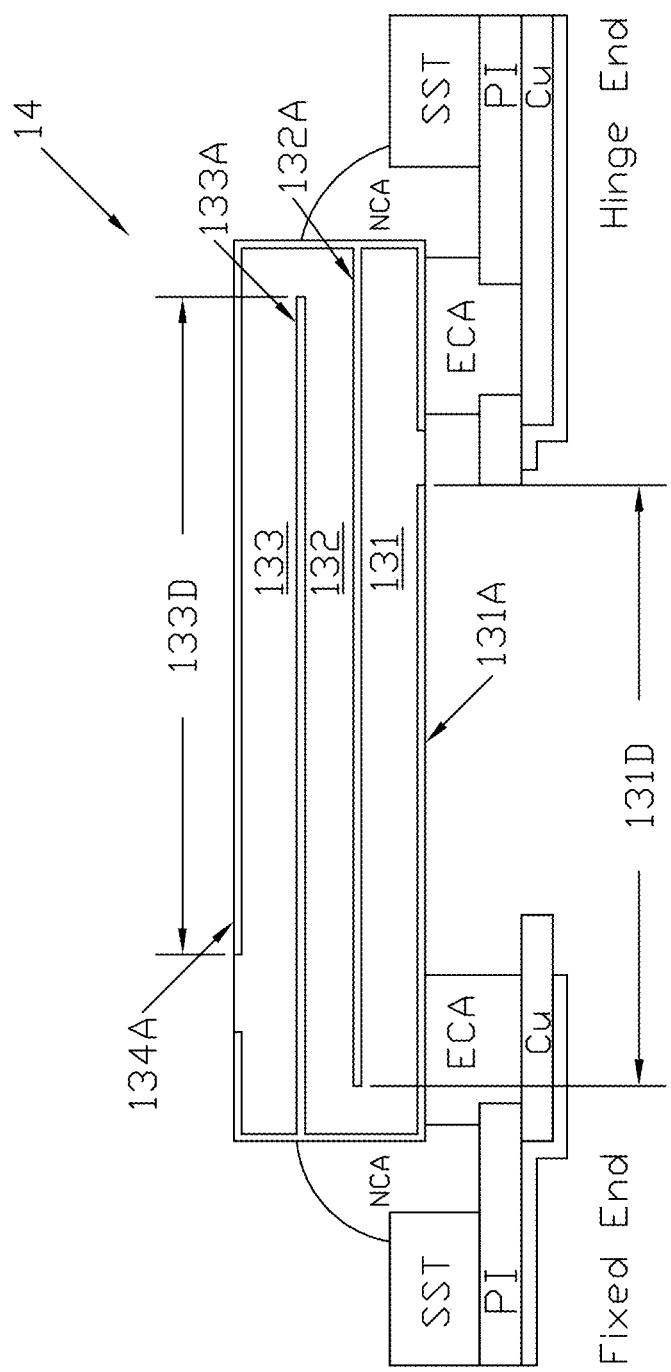
FIG. 4 illustrates a cross-sectional view of a multi-layer piezoelectric microactuators (PZT) in accordance with an embodiment of the disclosure.

FIG. 4 illustrates the cross-sectional view (A-A') of the multi-layer microactuator (PZT) 14 in accordance with an embodiment of the disclosure. A piezoelectric element is often used as the microactuator motor, although static electric microactuators and other types of microactuator motors have been proposed and used. A commonly used piezoelectric material is lead zirconate titanate (PZT), although other piezoelectric materials are also used and known. In the disclosure that follows, for simplicity the piezoelectric device that is the microactuator will sometimes be referred to simply as a "PZT" for shorthand, it being recognized that the piezoelectric material need not be lead zirconate titanate. Thus, as used herein the term "PZT" can refer to any piezoelectric material or any piezoelectric device formed of any piezoelectric material.

It should be understood that the multi-layer PZT 14 can be disposed on a suspension having configurations other than that illustrated in FIG. 3. The multi-layer PZT 114 can include a first electrode 131A disposed on at least a portion of the bottom surface of the first PZT layer 131. A second electrode 132A can be disposed between at least a portion of the first PZT layer 131 and the second PZT layer 132. A third electrode 133A can be disposed between at least a portion of the second PZT layer 132 and the third PZT layer 133. Finally, a fourth electrode 134A can be disposed on at least a portion of the top surface of the third PZT layer 133. The shared lengths of the first electrode 131A and the second electrode 132A can define the effective electrode length 131D. Furthermore, the shared lengths of the third electrode 133A and the fourth electrode 134A can define the effective electrode length 133D.

The effective electrode length 131D of the first PZT layer 131 can be 0.59 mm. It should be understood, in some embodiments the electrode length can be configured to have any desired length. The effective electrode length 133D of the third PZT layer 133 can be increased between 0 mm and 0.05 mm, according to some embodiments. In this case, the effective electrode length 133D of the third PZT layer 133 can be increased by 0.02 mm to 0.61 mm. In this case, the electrode dead zone 133C has been reduced to increase the effective electrode length 133D of the third PZT layer 133. Thus, the embodiments described are configured to reduce the T1FX mode gain under z-ht variations by reducing the bending of the multi-layer PZT 114 when an actuation voltage is applied.

Figure 5:
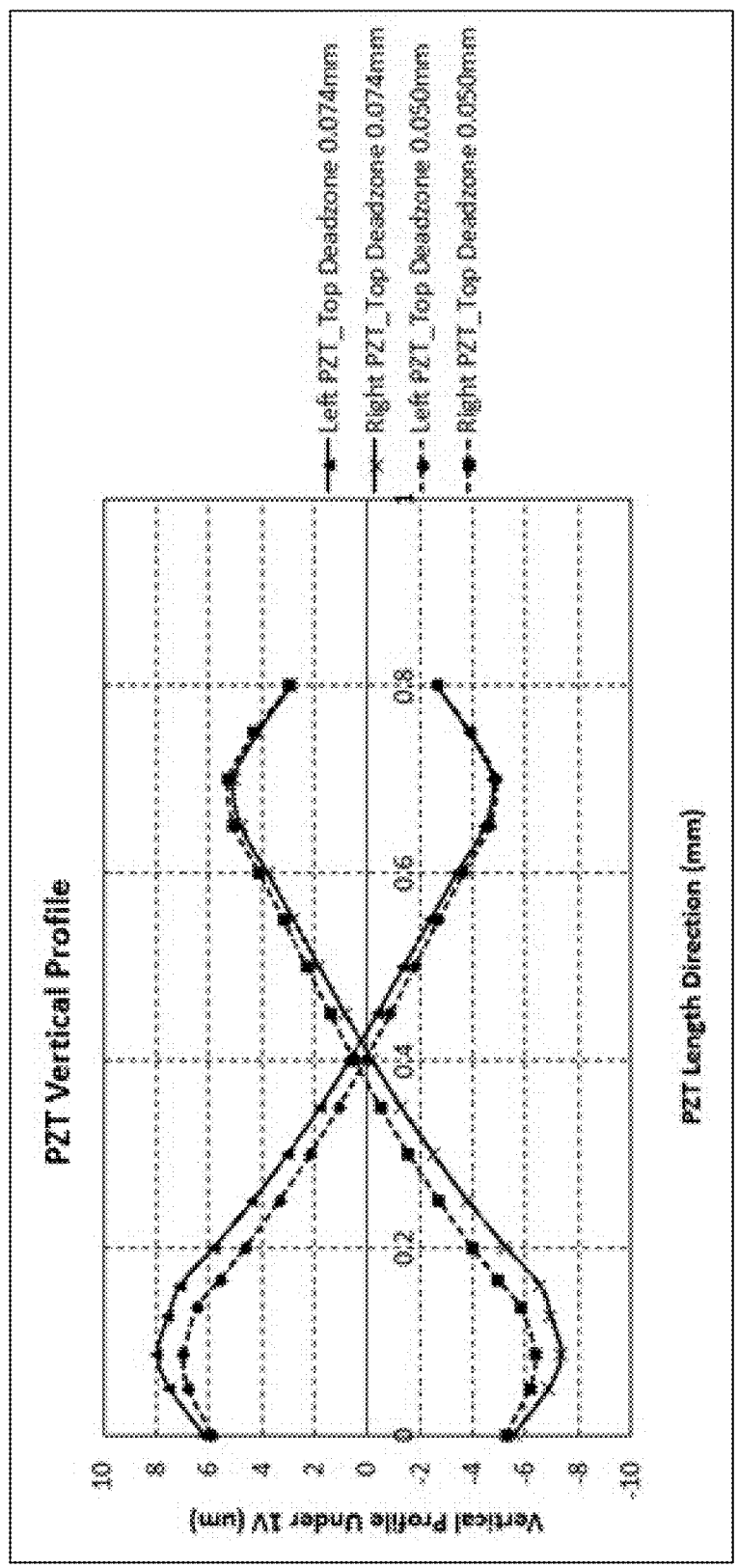
FIG. 5 is a graphical representation of a vertical profile of the multi-layer PZT in accordance with an embodiment of the disclosure under a one (1) volt actuation.

FIG. 5 is a graphical representation of a vertical profile of the multi-layer PZT according to embodiments described herein under a one (1) volt actuation. As is shown in FIG. 5, the shorter electrode dead zone 133C decreases the PZT bending at the hinge end by about 12.5%. For an example, the resonant frequency (FRF) of the multi-layer PZT in T1FX mode is reduced by ~2 dB under z-ht variation of +/−0.20 mm when compared with the current state of multi-layer microactuators. As T1FX gain improves at low frequency range, the drive servo bandwidth will also benefit.

Figure 6:
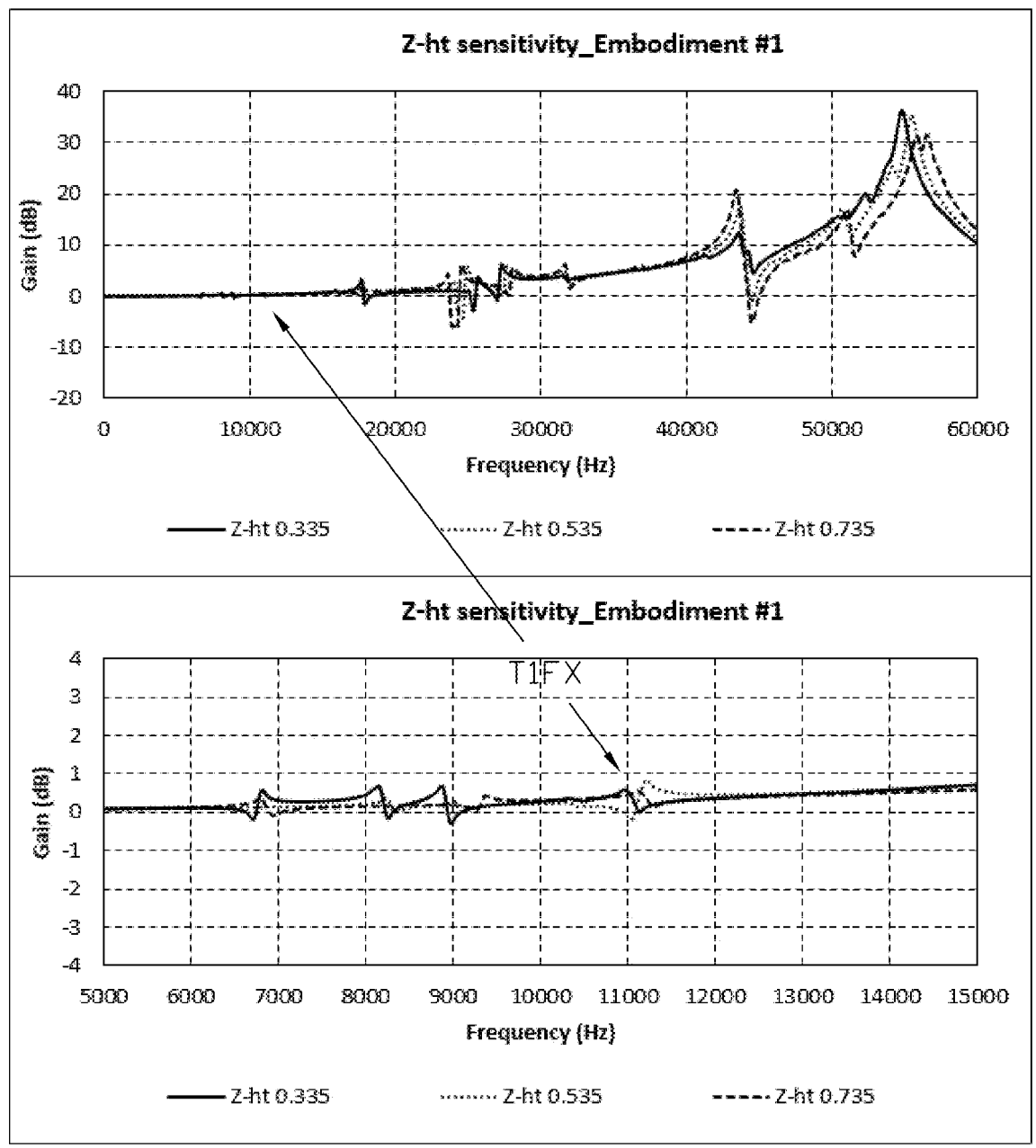
FIG. 6 is a graphical representation of a resonant frequency (FRF) of a multi-layer PZT in accordance with an embodiment of the disclosure under a one (1) volt actuation.

FIG. 6 illustrates the FRF of the multi-layer PZT according to embodiments described herein, under a one (1) volt actuation. FIG. 7 illustrates the FRF of the known multi-layer PZT, under a one (1) volt actuation. Compared to the known multi-layer PZT, the T1FX peak under a z-ht variation of +/−0.20 mm is reduced to less than 1 dB. As a result, a notch filter is not required to be placed in this low frequency range and a higher servo bandwidth can be achieved.

The disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. A piezoelectric actuator assembly comprising:
   a first single active piezoelectric layer including a top surface and a bottom surface;
   a second single active piezoelectric layer including a top surface and a bottom surface disposed over the top surface of the first single active piezoelectric layer; and
   a third single active piezoelectric layer including a top surface and a bottom surface disposed over the top surface of the second single active piezoelectric layer,
   a first effective electrode length of the first single active piezoelectric layer and the second single active piezoelectric layer, and
   a second effective electrode length of the second single active piezoelectric layer and the third single active piezoelectric layer is configured to be longer than the first effective electrode length.

2. The piezoelectric actuator assembly of claim 1, wherein a first electrode is disposed on at least a portion of the bottom surface of the first single active piezoelectric layer,
   wherein a second electrode is disposed between at least a portion of the first single active piezoelectric layer and the second single active piezoelectric layer, and
   wherein a shared length of the first electrode and the second electrode defines the first effective electrode length.

3. The piezoelectric actuator assembly of claim 1, wherein a third electrode is disposed between at least a portion of the second single active piezoelectric layer and the third single active piezoelectric layer,
   wherein a fourth electrode is disposed on at least a portion of top surface of the third single active piezoelectric layer, and
   wherein a shared length of the third electrode and the fourth electrode defines the second effective electrode length.

4. The piezoelectric actuator assembly of claim 1, wherein the second effective electrode length is 0.02 mm longer than the first effective electrode length.

5. The piezoelectric actuator assembly of claim 1, wherein the first effective electrode length is 0.59 mm.

6. The piezoelectric actuator assembly of claim 1, wherein the second effective electrode length is 0.61 mm.

7. A suspension comprising:
   a flexure mounted to a load beam;
   an electrical circuit mounted to the flexure;
   at least one multi-layer piezoelectric microactuator connected to the electrical circuit, each of the multi-layer piezoelectric actuator assembly comprising:
   a first single active piezoelectric layer including a top surface and a bottom surface;
   a second single active piezoelectric layer including a top surface and a bottom surface disposed over the top surface of the first single active piezoelectric layer; and
   a third single active piezoelectric layer including a top surface and a bottom surface disposed over the top surface of the second single active piezoelectric layer,
   a first effective electrode length of the first single active piezoelectric layer and the second single active piezoelectric layer, and
   a second effective electrode length of the second single active piezoelectric layer and the third single active piezoelectric layer is configured to be longer than the first effective electrode length.

8. The suspension of claim 7, wherein a first electrode is disposed on at least a portion of the bottom surface of the first single active piezoelectric layer,
   wherein a second electrode is disposed between at least a portion of the first single active piezoelectric layer and the second single active piezoelectric layer, and
   wherein a shared length of the first electrode and the second electrode defines the first effective electrode length.

9. The suspension of claim 7, wherein a third electrode is disposed between at least a portion of the second single active piezoelectric layer and the third single active piezoelectric layer,
   wherein a fourth electrode is disposed on at least a portion of top surface of the third single active piezoelectric layer, and
   wherein a shared length of the third electrode and the fourth electrode defines the second effective electrode length.

10. The suspension of claim 7, wherein the second effective electrode length is 0.02 mm longer than the first effective electrode length.

11. The suspension of claim 7, wherein the first effective electrode length is 0.59 mm.

12. The suspension of claim 7, wherein the second effective electrode length is 0.61 mm.

* * * * *